US012413872B2

(12) United States Patent
Lee et al.

(10) Patent No.: US 12,413,872 B2
(45) Date of Patent: Sep. 9, 2025

(54) IMAGE SENSOR AND IMAGE PROCESSING SYSTEM

(71) Applicant: SK hynix Inc., Gyeonggi-do (KR)

(72) Inventors: Eun Chang Lee, Gyeonggi-do (KR); Min Seok Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 160 days.

(21) Appl. No.: 18/190,975

(22) Filed: Mar. 28, 2023

(65) Prior Publication Data

US 2024/0114261 A1  Apr. 4, 2024

(30) Foreign Application Priority Data

Sep. 30, 2022 (KR) .................. 10-2022-0125348

(51) Int. Cl.
*H04N 25/77* (2023.01)
*G01S 7/4913* (2020.01)
*H10F 39/00* (2025.01)
*H10F 39/18* (2025.01)

(52) U.S. Cl.
CPC ........... *H04N 25/77* (2023.01); *G01S 7/4913* (2013.01); *H10F 39/18* (2025.01); *H10F 39/8037* (2025.01)

(58) Field of Classification Search
CPC .... H04N 25/77; H04N 25/621; H04N 25/706; H04N 25/78; H04N 25/62; H04N 25/705; H04N 25/53; H04N 25/59; H04N 25/766; G01S 7/4913; G01S 7/4914; G01S 17/36; G01S 17/894; H10F 39/18; H10F 39/8037; H10D 84/80; A23B 99/00

USPC ......................................................... 348/294
See application file for complete search history.

(56) References Cited

U.S. PATENT DOCUMENTS

| | | | | |
|---|---|---|---|---|
| 2002/0176067 | A1* | 11/2002 | Charbon ................ | H04N 25/57 348/E3.019 |
| 2008/0048100 | A1* | 2/2008 | Bamji ..................... | G01S 7/487 348/E3.019 |
| 2014/0267859 | A1* | 9/2014 | Wang ..................... | H04N 25/77 348/308 |
| 2016/0223884 | A1* | 8/2016 | Kususaki ............. | H04N 25/633 |
| 2019/0014276 | A1* | 1/2019 | Cheung ................ | H04N 25/533 |
| 2019/0149754 | A1* | 5/2019 | Otaka .................. | H04N 25/772 348/296 |
| 2020/0007798 | A1* | 1/2020 | Liu .......................... | G01J 1/44 |
| 2021/0385401 | A1* | 12/2021 | Yao ....................... | H10F 39/153 |
| 2023/0224608 | A1* | 7/2023 | Lim ....................... | H04N 25/79 348/207.99 |

FOREIGN PATENT DOCUMENTS

KR  10-2074949 B1  2/2020

* cited by examiner

*Primary Examiner* — Lin Ye
*Assistant Examiner* — Chan T Nguyen
(74) *Attorney, Agent, or Firm* — IP & T GROUP LLP

(57) ABSTRACT

Disclosed is an image sensor including a first tap pixel, a second tap pixel, and an overflow detection circuit suitable for detecting overflow of the first tap pixel based on a first tap pixel signal outputted from the first tap pixel and overflow of the second tap pixel based on a second tap pixel signal outputted from the second tap pixel, and forming a current path from an overflow current source to a ground voltage terminal when a voltage of the first tap pixel signal or a voltage of the second tap pixel signal drops below a predetermined voltage.

12 Claims, 5 Drawing Sheets

IMAGE SENSOR AND IMAGE PROCESSING SYSTEM

CROSS-REFERENCE TO RELATED APPLICATION

This application claims priority under 35 U.S.C. § 119 to Korean Patent Application No. 10-2022-0125348, filed on Sep. 30, 2022, which is incorporated herein by reference in its entirety.

BACKGROUND

1. Field

Various embodiments of the present disclosure relate to a data semiconductor circuit, and more particularly, to an image sensor and an image processing system.

2. Description of the Related Art

Recently, an image sensor that provides a three-dimensional (3D) distance image by simultaneously measuring a certain range of distances is being developed. Such a distance image is acquired based on Time-of-Flight (ToF) technology. According to the technology, distances may be measured by irradiating light from a light source near an image sensor and measuring the time taken for the light to be reflected off an object and returned.

The ToF technology is largely divided into direct ToF and indirect ToF. The direct ToF is to irradiate pulse-type light, measure the time taken for receiving the reflected light, and convert the measured time into distance. The precision of the direct ToF may be improved by making the pulse width as small as possible in consideration of the luminous flux. Also, the direct ToF requires very precise time measurement.

The indirect ToF does not directly measure the ToF, but the indirect ToF irradiates an object with modulated light, measures the phase difference with the reflected light, and extracts the distance. To be specific, according to the indirect ToF, the distance to an object may be measured by detecting the reflected light with a pixel of a tap A and a pixel of a tap B that are activated at different times, and using the difference between a value obtained by analog-to-digital converting a pixel signal of the tap A and a value obtained by analog-to-digital converting a pixel signal of the tap B.

Since the indirect ToF requires an analog-to-digital converter for analog-to-digital converting the pixel signal of the tap A and an analog-to-digital converter for analog-to-digital converting the pixel signal of the tap B, burden may be increased in terms of area.

A Current-Assisted Photonic Demodulator (CAPD) is one type of pixel circuitry used in an indirect ToF sensor. In the CAPD, electrons are generated in a pixel circuit by a majority current that is created through an application of a substrate voltage, and the generated electrons are detected by using a potential difference between electric fields. Since the CAPD is designed to use the majority current, the CAPD can rapidly detect electrons. In addition, the CAPD has an excellent efficiency by detecting some electrons formed at a deep depth.

SUMMARY

Various embodiments of the present disclosure are directed to an image sensor and an image processing system, which may prevent information errors by detecting overflow (i.e., electronic saturation of a floating diffusion node in a unit pixel) through an overflow detection circuit having a simple structure in a 2-tap pixel structure included in a pixel array.

These technical problems obtainable from the present disclosure are not limited to those described herein, and other technical problems not described herein will be apparently understood by those skilled in the art, to which the present disclosure pertains, from the following description.

In accordance with an embodiment of the present disclosure, an image sensor may include: a first tap pixel; a second tap pixel; and an overflow detection circuit suitable for detecting overflow of the first tap pixel based on a first tap pixel signal outputted from the first tap pixel and overflow of the second tap pixel based on a second tap pixel signal outputted from the second tap pixel, and forming a current path from an overflow current source to a ground voltage terminal when a voltage of the first tap pixel signal or a voltage of the second tap pixel signal drops below a predetermined voltage.

In accordance with an embodiment of the present disclosure, an image sensor may include: a first tap pixel; a second tap pixel; and an overflow detection circuit suitable for detecting overflow of the first tap pixel based on a first tap pixel signal outputted from the first tap pixel and overflow of the second tap pixel based on a second tap pixel signal outputted from the second tap pixel by performing a logic NAND operation on the first tap pixel signal and the second tap pixel signal and by outputting an overflow detection signal.

In accordance with an embodiment of the present disclosure, an image sensor may include: a first tap pixel; a second tap pixel; and an overflow detection circuit suitable for generating a first tap overflow detection signal and a second tap overflow detection signal by performing a logic NAND operation on a first tap pixel signal outputted from the first tap pixel and a second tap pixel signal outputted from the second tap pixel through a plurality of inverters connected in series to each other and NAND gates, and outputting an overflow detection signal by performing an OR operation on the first tap overflow detection signal and the second tap overflow detection signal through an OR gate.

In accordance with an embodiment of the present disclosure, an image processing system may include: a pixel array including a plurality of first tap pixels and a plurality of second tap pixels; an overflow detection circuit suitable for detecting overflow of the plurality of first tap pixels based on a plurality of first tap pixel signals outputted from the plurality of first tap pixels and overflow of the plurality of second tap pixels based on a plurality of second tap pixel signals outputted from the plurality of second tap pixels; and an image processing device suitable for calculating depth information based on the plurality of first tap pixel signals and the second tap plurality of second tap pixel signals.

In accordance with an embodiment of the present disclosure, an operating method of an image sensor may include: generating first and second pixel signals respectively through first and second tap pixels included therein; and detecting each voltage level of the first and second pixel signals to determine an overflow of at least one of the first and second tap pixels.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

Figure 1:
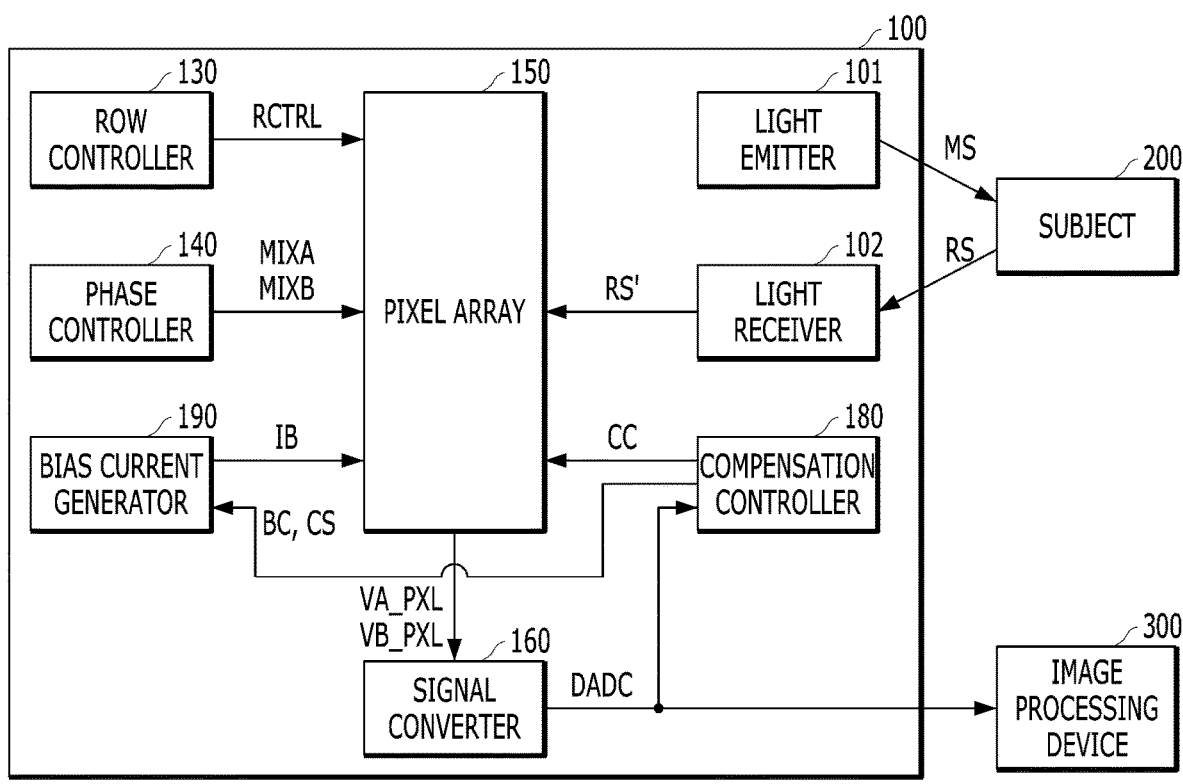
FIG. 1 is a block diagram illustrating an image processing system in accordance with an embodiment of the present disclosure.

Hereinafter, an image processing system according to an embodiment of the present disclosure is described with reference to FIG. 1. FIG. 1 is a block diagram illustrating an image processing system 1000 in accordance with an embodiment of the present disclosure.

Referring to FIG. 1, the image processing system 1000 according to the present embodiment includes an image sensor 100 and an image processing device 300.

The image sensor 100 may measure depth information indicating a depth from a subject 200 using a time of flight (ToF) method. For example, the image sensor 100 may measure the depth information by detecting a phase difference between emitted light MS that is emitted to the outside thereof and incident light RS that is incident on the inside thereof.

For example, the image sensor 100 may include a light emitter 101, a light receiver 102, a row controller 130, a phase controller 140, a pixel array 150, a signal converter 160, a compensation controller 180, and a bias current generator 190.

The light emitter 101 may be enabled during an exposure time period, i.e., an integration time period. The light emitter 101 may emit the emitted light MS to the subject 200 during the exposure time period. For example, the emitted light MS may be a periodic signal that periodically toggles.

The light receiver 102 may be enabled during the exposure time period. The light receiver 102 may receive the incident light RS during the exposure time period, and transfer received incident light RS' to the pixel array 150. For example, the incident light RS may include reflected light which is light received by the light receiver 102 after the emitted light MS is reflected by the subject 200, and background light that is present on or near the periphery of the subject 200.

The row controller 130 may generate a plurality of row control signals RCTRL for controlling respective rows of the pixel array 150. For example, the row controller 130 may generate first row control signals for controlling pixels arranged in a first row of the pixel array 150, and generate $n^{th}$ row control signals for controlling pixels arranged in an $n^{th}$ row of the pixel array 150, where "n" is a natural number greater than 2.

The phase controller 140 may be enabled during the exposure time period. The phase controller 140 may generate control signals MIXA and MIXB that periodically toggle during the exposure time period. For example, each of the control signals MIXA and MIXB may have the same phase and period as the emitted light MS. For convenience in description, although the present embodiment describes as an example that the control signals MIXA and MIXB are generated, the present disclosure is not necessarily limited thereto.

The pixel array 150 may include a plurality of first tap pixels (reference numeral 110 of FIG. 2) and a plurality of second tap pixels (reference numeral 120 of FIG. 2), and the first and second tap pixels 110 and 120 are described in detail below with reference to FIGS. 2 to 5. In addition, an overflow detection circuit (reference numeral 155 of FIG. 2) for detecting overflow of a first tap based on a first tap pixel signal VA_PXL outputted from the first tap pixel 110 and overflow of a second tap based on a second tap pixel signal VB_PXL outputted from the second tap pixel 120 are described in detail below with reference to FIGS. 2 to 5.

The pixel array 150 may generate the plurality of pixel signals VA_PXL and VB_PXL on the basis of the received incident light RS', the plurality of row control signals RCTRL, the control signals MIXA and MIXB, a bias current IB and compensation control signals CC. Each of the plurality of pixel signals VA_PXL and VB_PXL may be a signal corresponding to the reflected light remaining after the background light of the incident light RS is removed. Each of the plurality of pixel signals VA_PXL and VB_PXL may be an analog-type signal. The pixel array 150 may include a plurality of unit pixels, i.e., depth sensing pixels, for measuring the depth from the subject 200. For example, each of the unit pixels may be selected on the basis of row control signals assigned among the plurality of row control signals RCTRL, and generate the plurality of pixel signals VA_PXL and VB_PXL on the basis of the control signals MIXA and MIXB, the received incident light RS', the bias current IB and each of the compensation control signals CC. The unit pixels are described in more detail with reference to FIG. 2.

The signal converter 160 may convert the plurality of analog-type pixel signals VA_PXL and VB_PXL into a plurality of digital-type pixel signals DADC. For example, the signal converter 160 may include an analog-to-digital converter.

The compensation controller 180 may generate the plurality of compensation control signals CC, at least one bias control signal BC and a plurality of selection control signals CS on the basis of the plurality of pixel signals DADC. The plurality of compensation control signals CC may be signals indicating whether floating diffusion nodes included in the respective unit pixels are saturated. The number of the plurality of compensation control signals CC may be generated corresponding to the number of the plurality of unit pixels. The bias control signal BC and the plurality of selection control signals CS may be generated according to whether the respective unit pixels are saturated. For example, the bias control signal BC may be one commonly used signal, and the number of the plurality of selection control signals CS may be generated corresponding to the number of columns of the pixel array 150.

The compensation controller 180 may serve to correct the plurality of pixel signals DADC to be generated during a current frame period by using the plurality of pixel signals DADC generated during a previous frame period. The compensation controller 180 is described in more detail with reference to FIG. 3.

The bias current generator 190 may supply the bias current IB to a compensation element CT included in each of the unit pixels on the basis of the bias control signal BC and the selection control signals CS.

The image processing device 300 may measure, i.e., calculate, the depth information on the basis of the plurality of pixel signals DADC. Since a method of measuring the depth information is publicly known, and is not significantly related to the subject matter of the present disclosure, a detailed description thereof is omitted from the embodiment of the present disclosure.

Moreover, at least the pixel array 150 among the light emitter 101, the light receiver 102, the row controller 130, the phase controller 140, the pixel array 150, the signal converter 160, the compensation controller 180 and the bias current generator 190 may be disposed in an analog region, and the compensation controller 180 and the bias current generator 190 may be disposed in a digital region.

That is, the configuration related to the unit pixels such as the pixel array 150 and the configuration for removing the background light such as the compensation controller 180 and the bias current generator 190 may be disposed in separate regions that do not affect each other in terms of area. For example, the configuration related to the unit pixels such as the pixel array 150 and the configuration for removing the background light such as the compensation controller 180 and the bias current generator 190 may be integrated on different chips.

Figure 2:
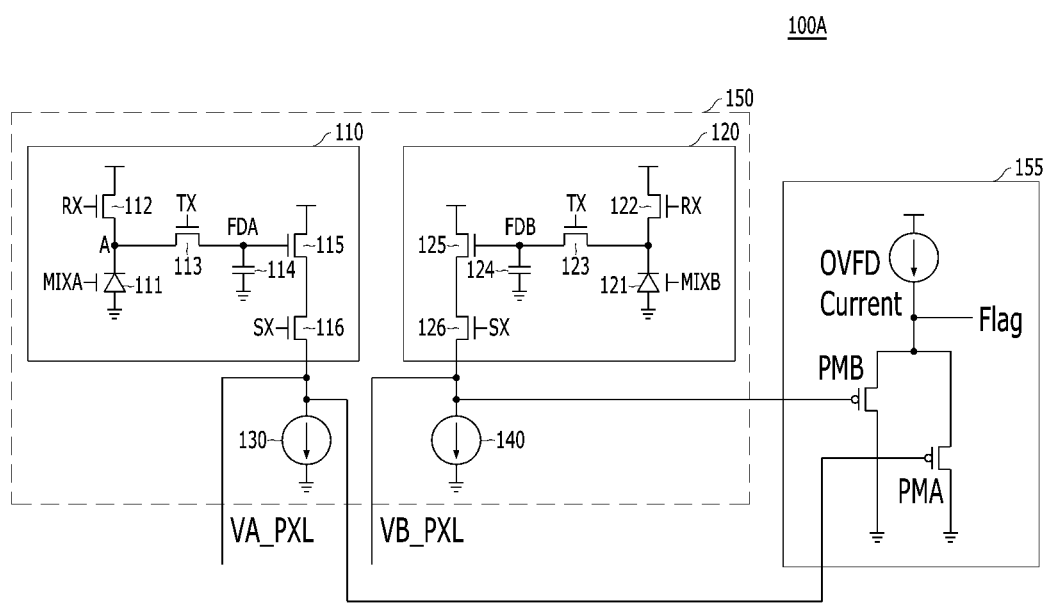
FIG. 2 is a circuit diagram illustrating in detail a configuration of an image sensor in accordance with an embodiment of the present disclosure.
Figure 3:
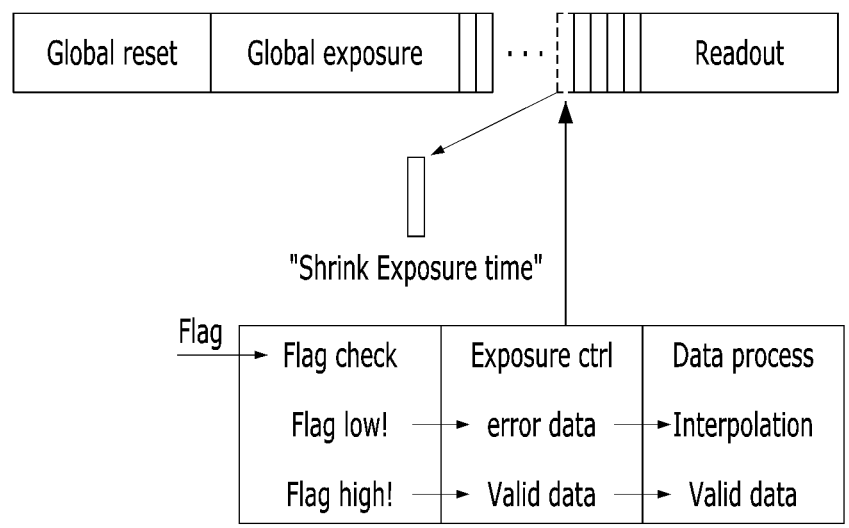
FIG. 3 is a diagram illustrating a data processing concept according to a voltage level of an overflow detection signal illustrated in FIG. 2 in accordance with an embodiment of the present disclosure.

Hereinafter, a configuration of an image sensor 100A in accordance with another embodiment of the present disclosure is described in detail with reference to FIGS. 2 and 3. FIG. 2 is a circuit diagram illustrating in detail the configuration of the image sensor 100A in accordance with another embodiment of the present disclosure, and FIG. 3 is a diagram illustrating a data processing concept according to a voltage level of an overflow detection signal Flag illustrated in FIG. 2 in accordance with another embodiment of the present disclosure.

The image sensor 100A illustrated in FIG. 2 may include a pixel array 150 and an overflow detection circuit 155, and be applied to the image sensor 100 illustrated in FIG. 1.

The pixel array 150 may include a plurality of pixels having a 2-tap pixel structure. For example, the pixel array 150 includes the first tap pixel 110 (corresponding to a first tap), the second tap pixel 120 (corresponding to a second tap), a first pixel signal output unit 130, and a second pixel signal output unit 140.

The first tap pixel 110 may detect light in a period in which a first control signal MIXA is activated. The first tap pixel 110 may include a first photodetector 111, a first reset transistor 112, a first transfer transistor 113, a first capacitor 114, a first driving transistor 115, and a first selection transistor 116. The first photodetector 111 may perform a photoelectric conversion function. The first photodetector 111 may be implemented using at least one of a photo diode, a photo transistor, a photo gate, a pinned photo diode and combinations thereof.

The first photodetector 111 may be activated in a period in which a signal is activated at a high voltage level, under the control of the first control signal MIXA. The first reset transistor 112 may transfer a power source voltage to a node A in response to a reset signal RX. The first transfer transistor 113 may electrically connect the node A to a first floating diffusion node FDA in response to a transfer signal TX. The first floating diffusion node FDA may be a node in which charges corresponding to light detected by the first photodetector 111 or charges corresponding to an initialization voltage is accumulated. The first capacitor 114 may be connected to the first floating diffusion node FDA.

The first driving transistor 115 may have a gate connected to the first floating diffusion node FDA, and a drain and a source connected between a power source voltage terminal and the first selection transistor 116. The first driving transistor 115 may serve to amplify a voltage of the first floating diffusion node FDA. The first selection transistor 116 may transfer a current transferred from the first driving transistor 115 to a node from which the first tap pixel signal VA_PXL is outputted, in response to a selection signal SX.

The second tap pixel 120 may detect light in a period in which a second control signal MIXB is activated. The first and second control signals MIXA and MIXB may have the same frequency and periodic waves with different phases.

The second tap pixel 120 may include a second photodetector 121, a second reset transistor 122, a second transfer transistor 123, a second capacitor 124, a second driving transistor 125, and a second selection transistor 126. The second photodetector 121 may perform a photoelectric conversion function. The second photodetector 121 may be implemented using at least one of a photo diode, a photo transistor, a photo gate, a pinned photo diode and combinations thereof.

The second photodetector 121 may be activated in a period in which a signal is activated at a high level, under the control of the second control signal MIXB. The second reset transistor 122 may transfer the power source voltage to a node B in response to the reset signal RX. The second transfer transistor 123 may electrically connect the node B to a second floating diffusion node FDB in response to the transfer signal TX. The second floating diffusion node FDB may be a node in which charges corresponding to light detected by the second photodetector 121 or charges corresponding to an initialization voltage is accumulated. The second capacitor 124 may be connected to the second floating diffusion node FDB.

The second driving transistor 125 may have a gate connected to the second floating diffusion node FDB, and a drain and a source connected between the power source voltage terminal and the second selection transistor 126. The second driving transistor 125 may serve to amplify a voltage of the second floating diffusion node FDB. The second selection transistor 126 may transfer a current transferred from the second driving transistor 125 to a node from which the second tap pixel signal VB_PXL is outputted, in response to the selection signal SX.

The first pixel signal output unit 130 may allow a constant current to sink from the node from which the first tap pixel signal VA_PXL is outputted. A voltage level of the first tap pixel signal VA_PXL is determined by the amount of currents sourced from the first selection transistor 116 and the amount of currents sinking by the first pixel signal output unit 130. Herein, the amount of currents sinking by the first pixel signal output unit 130 is a constant amount, and the amount of currents sourced from the first selection transistor 116 increases as the voltage level of the first floating diffusion node FDA increases. Accordingly, the voltage level of the first tap pixel signal VA_PXL may increase as the voltage level of the first floating diffusion node FDA increases. The first pixel signal output unit 130 may include a current source.

The second pixel signal output unit 140 may allow a constant current to sink from the node from which the second tap pixel signal VB_PXL is outputted. A voltage level of the second tap pixel signal VB_PXL is determined by the amount of currents sourced from the second selection transistor 126 and the amount of currents sinking by the second pixel signal output unit 140. Herein, the amount of sinking currents of the second pixel signal output unit 140 is a constant, and the amount of sourced currents of the second selection transistor 126 increases as the voltage level of the second floating diffusion node FDB increases. Accordingly, the voltage level of the second tap pixel signal VB_PXL may increase as the voltage level of the second floating diffusion node FDB increases. The second pixel signal output unit 140 may include a current source.

The overflow detection circuit 155 may detect overflow of the first tap based on the first tap pixel signal VA_PXL outputted from the first tap pixel 110 and overflow of the second tap based on the pixel signal VB_PXL of the second tap outputted from the second tap pixel 120, and form a current path from an overflow current source OVFD Current to a ground voltage terminal GND when the voltage of the first tap pixel signal VA_PXL or the voltage of the second tap pixel signal VB_PXL drops below a predetermined voltage. When the current path is formed toward the ground voltage terminal GND, the overflow detection circuit 155 may output the overflow detection signal Flag whose voltage is changed by the current path.

That is, when a detection node voltage at any node from which the first tap pixel signal VA_PXL or the second tap pixel signal VB_PXL is outputted drops below the predetermined voltage, a first PMOS transistor PMA coupled to an output node of the first tap pixel 110 or a second PMOS transistor PMB coupled to an output node of the second tap pixel 120 is turned on, and the current path is formed from the overflow current source OVFD Current to the ground voltage terminal GND so that the voltage of the overflow detection signal Flag may shift from a logic high level to a logic low level.

Referring to FIG. 3, when the overflow detection signal Flag has a logic low level, error data is generated in the first tap pixel 110 or the second tap pixel 120. Accordingly, the image processing device 300 may perform an image data process operation through interpolation of peripheral pixel data positioned on or near the periphery of the first tap pixel 110 or the second tap pixel 120, and light global exposure time may be controlled so that the light global exposure time is reduced until no overflow occurs.

In addition, when the voltage of the overflow detection signal Flag has a logic high level, the image processing device 300 processes valid data of the first tap pixel 110 or the second tap pixel 120, and the control over the light global exposure time does not operate since the image processing device 300 does not control the light global exposure time.

Figure 4:
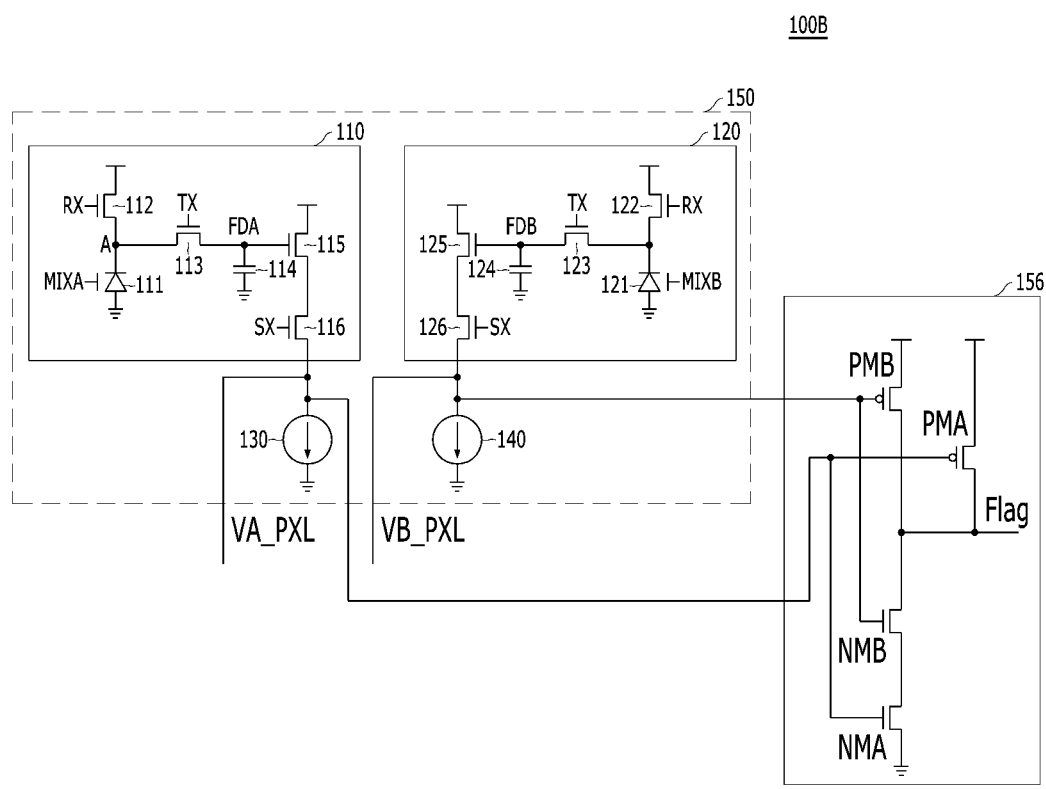
FIG. 4 is a circuit diagram illustrating in detail the configuration of the image sensor in accordance with another embodiment of the present disclosure.

Hereinafter, a configuration of an image sensor 100B in accordance with another embodiment of the present disclosure is described in detail with reference to FIG. 4. FIG. 4 is a circuit diagram illustrating in detail the configuration of the image sensor 100B in accordance with another embodiment of the present disclosure.

The image sensor 100B illustrated in FIG. 4 may include a pixel array 150 and an overflow detection circuit 156, and be applied to the image sensor 100 illustrated in FIG. 1.

Since the configuration and operation of the pixel array 150 illustrated in FIG. 4 are the same as those of the pixel array 150 illustrated in FIG. 2, a detailed description of the pixel array 150 illustrated in FIG. 4 is omitted.

The overflow detection circuit 156 illustrated in FIG. 4 may include a first PMOS transistor PMA, a second PMOS transistor PMB, a first NMOS transistor NMA, and a second NMOS transistor NMB.

One end of the first PMOS transistor PMA may be connected to a power source voltage, the other end of the first PMOS transistor PMA may be connected to a connection node between the other end of the second PMOS transistor PMB and the one end of the second NMOS transistor NMB, and an overflow detection signal Flag may be outputted from the connection node. In addition, one end of the second PMOS transistor PMB may be connected to the power source voltage, the other end of the second PMOS transistor PMB may be connected in series to one end of the first NMOS transistor NMA, the other end of the first NMOS transistor NMA may be connected in series to one end of the second NMOS transistor NMB, and the other end of the second NMOS transistor NMB may be connected to a ground voltage terminal GND.

The overflow detection circuit 156 may perform a logic NAND operation using the first PMOS transistor PMA, the second PMOS transistor PMB, the first NMOS transistor NMA and the second NMOS transistor NMB, thereby detecting overflow of a first tap based on a first tap pixel signal VA_PXL outputted from a first tap pixel 110 and overflow of a second tap based on a second tap pixel signal VB_PXL outputted from a second tap pixel 120, and outputting the overflow detection signal Flag.

When the first tap pixel signal VA_PXL outputted from the first tap pixel 110 has a logic low level indicating an overflow state, and the second tap pixel signal VB_PXL outputted from the second tap pixel 120 has the logic low level indicating an overflow state, the overflow detection circuit 156 may output the overflow detection signal Flag having a logic high level indicating the overflow state through the logic NAND operation using the first PMOS transistor PMA, the second PMOS transistor PMB, the first NMOS transistor NMA and the second NMOS transistor NMB.

In addition, when the first tap pixel signal VA_PXL outputted from the first tap pixel 110 has a logic high level indicating a non-overflow state, and the second tap pixel signal VB_PXL outputted from the second tap pixel 120 has the logic low level indicating an overflow state, the overflow detection circuit 156 may output the overflow detection signal Flag having the logic high level indicating the overflow state through the logic NAND operation using the first PMOS transistor PMA, the second PMOS transistor PMB, the first NMOS transistor NMA and the second NMOS transistor NMB.

Furthermore, when the first tap pixel signal VA_PXL outputted from the first tap pixel 110 has the logic low level indicating an overflow state, and the second tap pixel signal VB_PXL outputted from the second tap pixel 120 has the logic high level indicating a non-overflow state, the overflow detection circuit 156 may output the overflow detection signal Flag having the logic high level indicating the overflow state through the logic NAND operation using the first PMOS transistor PMA, the second PMOS transistor PMB, the first NMOS transistor NMA and the second NMOS transistor NMB.

Moreover, when the first tap pixel signal VA_PXL outputted from the first tap pixel 110 has the logic high level indicating a non-overflow state, and the second tap pixel signal VB_PXL outputted from the second tap pixel 120 has the logic high level indicating a non-overflow state, the overflow detection circuit 156 may output the overflow detection signal Flag having the logic low level indicating the non-overflow state through the logic NAND operation using the first PMOS transistor PMA, the second PMOS transistor PMB, the first NMOS transistor NMA and the second NMOS transistor NMB.

Figure 5:
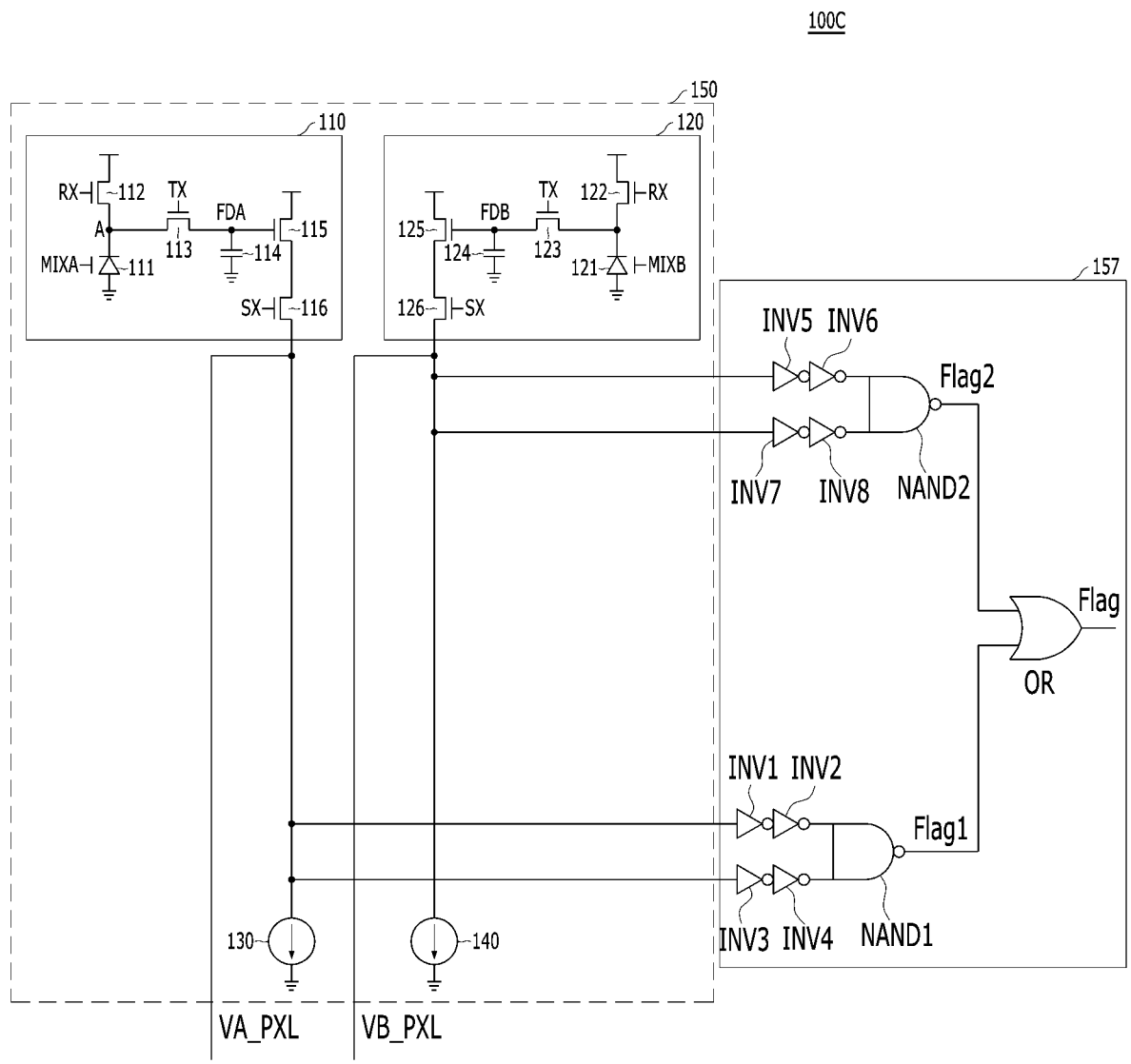
FIG. 5 is a circuit diagram illustrating in detail the configuration of the image sensor in accordance with another embodiment of the present disclosure.

Hereinafter, a configuration of an image sensor 100C in accordance with another embodiment of the present disclosure is described in detail with reference to FIG. 5. FIG. 5 is a circuit diagram illustrating in detail the configuration of the image sensor 100C in accordance with another embodiment of the present disclosure.

The image sensor 100C illustrated in FIG. 5 may include a pixel array 150 and an overflow detection circuit 157, and be applied to the image sensor 100 illustrated in FIG. 1.

Since the configuration and operation of the pixel array 150 illustrated in FIG. 5 are the same as those of the pixel array 150 illustrated in FIG. 2, a detailed description of the pixel array 150 illustrated in FIG. 5 is omitted.

The overflow detection circuit 157 illustrated in FIG. 5 may include a first inverter group INV1 and INV2, a second inverter group INV3 and INV4, a first NAND gate NAND1, a third inverter group INV5 and INV6, a fourth inverter group INV7 and INV8, a second NAND gate NAND2, and an OR gate OR.

The first inverter group INV1 and INV2 includes a plurality of inverters INV1 and INV2 connected in series to each other. A first tap pixel signal VA_PXL is inputted and delayed through the plurality of inverters INV1 and INV2, and the delayed first tap pixel signal VA_PXL is inputted to one end of the first NAND gate NAND1.

The second inverter group INV3 and INV4 includes a plurality of inverters INV3 and INV4 connected in series to each other. The first tap pixel signal VA_PXL is inputted and delayed through the plurality of inverters INV3 and INV4, and the delayed first tap pixel signal VA_PXL is inputted to the other end of the first NAND gate NAND1 through the plurality of inverters INV3 and INV4 connected in series to each other.

The delayed first tap pixel signal VA_PXL may be inputted to each of one end and the other end of the first NAND gate NAND1, and the first NAND gate NAND1 may perform a logic NAND operation according to the inputted first tap pixel signal VA_PXL, and output a first tap overflow detection signal Flag1.

The third inverter group INV5 and INV6 includes a plurality of inverters INV5 and INV6 connected in series to each other, a second tap pixel signal VB_PXL is inputted, and the delayed second tap pixel signal VB_PXL is inputted to one end of the second NAND gate NAND2 through the plurality of inverters INV5 and INV6 connected in series to each other.

The fourth inverter group INV7 and INV8 includes a plurality of inverters INV7 and INV8 connected in series to each other, the second tap pixel signal VB_PXL is inputted, and the delayed second tap pixel signal VB_PXL is inputted to the other end of the second NAND gate NAND2 through the plurality of inverters INV7 and INV8 connected in series to each other.

The delayed second tap pixel signal VB_PXL may be inputted to each of one end and the other end of the second NAND gate NAND2, and the second NAND gate NAND2 may perform a logic NAND operation according to the inputted second tap pixel signal VB_PXL, and output a second tap overflow detection signal Flag2.

The OR gate OR may receive the first tap overflow detection signal Flag1 and the second tap overflow detection signal Flag2 through an input terminal thereof, perform an OR operation, and output an overflow detection signal Flag.

That is, the overflow detection circuit 157 may output the first tap overflow detection signal Flag1 and the second tap overflow detection signal Flag2 by performing the logic NAND operation on each of the first tap pixel signal VA_PXL outputted from a first tap pixel 110 and the second tap pixel signal VB_PXL outputted from a second tap pixel 120 through the inverters connected in series to each other and the NAND gates, and output the overflow detection signal Flag by performing the OR operation on the overflow detection signal Flag1 and the overflow detection signal Flag2 through the OR gate OR.

Hereinafter, an operation of the overflow detection circuit 157 is described.

When the first tap pixel signal VA_PXL outputted from the first tap pixel 110 has a logic low level indicating an overflow state, and the second tap pixel signal VB_PXL outputted from the second tap pixel 120 has the logic low level indicating an overflow state, the overflow detection circuit 157 may output the overflow detection signal Flag having a logic high level indicating the overflow state through the operations using the first inverter group INV1 and INV2, the second inverter group INV3 and INV4, the first NAND gate NAND1, the third inverter group INV5 and INV6, the fourth inverter group INV7 and INV8, the second NAND gate NAND2 and the OR gate OR.

In addition, when the first tap pixel signal VA_PXL outputted from the first tap pixel 110 has a logic high level indicating a non-overflow state, and the second tap pixel signal VB_PXL outputted from the second tap pixel 120 has the logic low level indicating an overflow state, the overflow detection circuit 157 may output the overflow detection signal Flag having the logic high level indicating the overflow state through the operations using the first inverter group INV1 and INV2, the second inverter group INV3 and INV4, the first NAND gate NAND1, the third inverter group INV5 and INV6, the fourth inverter group INV7 and INV8, the second NAND gate NAND2 and the OR gate OR.

Furthermore, when the first tap pixel signal VA_PXL outputted from the first tap pixel 110 has the logic low level indicating an overflow state, and the second tap pixel signal VB_PXL outputted from the second tap pixel 120 has the logic high level indicating a non-overflow state, the overflow detection circuit 157 may output the overflow detection signal Flag having the logic high level indicating the overflow state through the operations using the first inverter group INV1 and INV2, the second inverter group INV3 and INV4, the first NAND gate NAND1, the third inverter group INV5 and INV6, the fourth inverter group INV7 and INV8, the second NAND gate NAND2 and the OR gate OR.

Moreover, when the first tap pixel signal VA_PXL outputted from the first tap pixel 110 has the logic high level indicating a non-overflow state, and the second tap pixel signal VB_PXL outputted from the second tap pixel 120 has the logic high level indicating a non-overflow state, the overflow detection circuit 157 may output the overflow detection signal Flag having the logic low level indicating the non-overflow state through the operations using the first inverter group INV1 and INV2, the second inverter group INV3 and INV4, the first NAND gate NAND1, the third inverter group INV5 and INV6, the fourth inverter group INV7 and INV8, the second NAND gate NAND2 and the OR gate OR.

As described above, the image sensor and image processing system according to the embodiments of the present disclosure may detect an overflow detection signal through an overflow detection circuit having a simple structure in a 2-tap pixel structure included in a pixel array, thereby preventing information errors from occurring. An image sensor and an image processing system according to embodiments of the present disclosure can detect an overflow detection signal through an overflow detection circuit having a simple structure in a 2-tap pixel structure included in a pixel array, thereby preventing information errors from occurring.

Effects obtainable from the present disclosure are not limited to those described above, and other effects not described herein will be apparently understood by those skilled in the art, to which the present disclosure pertains, from the above description.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. The embodiments disclosed may be combined to form additional embodiments.

What is claimed is:

1. An image sensor comprising:
   a first tap pixel;
   a second tap pixel; and
   an overflow detection circuit suitable for:
   detecting overflow of the first tap pixel based on a first tap pixel signal outputted from the first tap pixel and overflow of the second tap pixel based on a second tap pixel signal outputted from the second tap pixel, and
   forming a current path from an overflow current source to a ground voltage terminal when a voltage of the first tap pixel signal or a voltage of the second tap pixel signal drops below a predetermined voltage.

2. The image sensor of claim 1, wherein the overflow detection circuit is further suitable for outputting an overflow detection signal whose voltage is changed by the formed current path.

3. The image sensor of claim 2, wherein when a voltage detected at a node, from which the first tap pixel signal or the second tap pixel signal is outputted, drops below the predetermined voltage, a first PMOS transistor coupled to an output node of the first tap pixel or a second PMOS transistor coupled to an output node of the second tap pixel is turned on and the current path is formed from the overflow current source to the ground voltage terminal so that a voltage of the overflow detection signal shifts from a logic high level to a logic low level.

4. The image sensor of claim 1, wherein the first tap pixel includes:
   a first photodetector connected to a first node;
   a first reset transistor suitable for resetting the first node in response to a reset signal;
   a first transfer transistor suitable for electrically connecting the first node to a first floating diffusion node in response to a transfer signal;
   a first capacitor connected to the first floating diffusion node;
   a first driving transistor suitable for amplifying a voltage of the first floating diffusion node; and
   a first selection transistor suitable for outputting the voltage amplified by the first driving transistor to a first tap output line in response to a first selection signal.

5. The image sensor of claim 1, wherein the second tap pixel includes:
   a second photodetector connected to a second node;
   a second reset transistor suitable for resetting the second node in response to a reset signal;
   a second transfer transistor suitable for electrically connecting the second node to a second floating diffusion node in response to a transfer signal;
   a second capacitor connected to the second floating diffusion node;
   a second driving transistor suitable for amplifying a voltage of the second floating diffusion node; and
   a second selection transistor suitable for outputting the voltage amplified by the second driving transistor to a second tap output line in response to a second selection signal.

6. An image processing system comprising:
   a pixel array including a plurality of first tap pixels and a plurality of second tap pixels;
   an overflow detection circuit suitable for detecting overflow of the plurality of first tap pixels based on a plurality of first tap pixel signals outputted from the plurality of first tap pixels and overflow of the plurality of second tap pixels based on a plurality of second tap pixel signals outputted from the plurality of second tap pixels; and
   an image processing device suitable for calculating depth information based on the plurality of first tap pixel signals and the plurality of second tap pixel signals,
   wherein the overflow detection circuit forms a current path from an overflow current source to a ground voltage terminal and outputs an overflow detection signal whose voltage is changed when voltages of the plurality of first tap pixel signals and voltages of the plurality of second tap pixel signals drop below a predetermined voltage.

7. The image processing system of claim 6, wherein when the overflow detection signal has a logic low level, error data is generated in the first tap pixel or the second tap pixel, and
   wherein the image processing device performs an image data process through interpolation of peripheral pixel data positioned on or near a periphery of the first tap pixel or the second tap pixel, and controls light global exposure time so that the light global exposure time is reduced until no overflow occurs.

8. The image processing system of claim 6, wherein when the overflow detection signal has a logic high level, the image processing device is performs a process on a valid data of the first tap pixel and the second tap pixel and does not control light global exposure time.

9. The image processing system of claim 6, wherein the overflow detection circuit detects overflow of the plurality of first tap pixel signals outputted from the plurality of first tap pixels and overflow of the plurality of second tap pixel signals outputted from the plurality of second tap pixels, performs a logic NAND operation on the plurality of first tap pixel signals and the plurality of second tap pixel signals, and outputs an overflow detection signal.

10. The image processing system of claim 6, wherein the overflow detection circuit performs a logic NAND operation on the plurality of first tap pixel signals outputted from the plurality of first tap pixels and the plurality of second tap pixel signals outputted from the plurality of second tap pixels through a plurality of inverters connected in series to each other and NAND gates, generates a first tap overflow detection signal and a second tap overflow detection signal, performs an OR operation on the overflow detection signals through an OR gate, and outputs an overflow detection signal.

11. The image processing system of claim 10, wherein the overflow detection circuit includes:

a first inverter group to which the plurality of first tap pixel signals are inputted, and including the plurality of inverters connected in series to each other;

a second inverter group to which the plurality of first tap pixel signals are inputted, and including the plurality of inverters connected in series to each other;

a first NAND gate suitable for receiving an output of the first inverter group through a first input terminal thereof, receiving an output of the second inverter group through a second input terminal thereof, performing the logic NAND operation on the received outputs, and generating the first tap overflow detection signal;

a third inverter group to which the plurality of second tap pixel signals are inputted, and including the plurality of inverters connected in series to each other;

a fourth inverter group to which the plurality of second tap pixel signals are inputted, and including the plurality of inverters connected in series to each other;

a second NAND gate suitable for receiving an output of the third inverter group through a first input terminal thereof, receiving an output of the fourth inverter group through a second input terminal thereof, performing the logic NAND operation on the received outputs, and generating the second tap overflow detection signal; and an OR gate suitable for receiving the first tap overflow detection signal and the second tap overflow detection signal, performing the OR operation on the received overflow detection signals, and outputting the overflow detection signal.

12. An operating method of an image sensor, the operating method comprising:

generating first and second tap pixel signals respectively through first and second tap pixels included therein; and detecting each voltage level of the first and second tap pixel signals to determine an overflow of at least one of the first and second tap pixels, wherein the detecting each voltage level of the first and second tap pixel signals includes forming of a current path from an overflow current source to a ground voltage terminal; and outputting an overflow detection signal whose voltage is changed when voltages of the first and second tap pixel signals drop below a predetermined voltage.

* * * * *